United States Patent [19]

Huang et al.

[11] Patent Number: 5,116,774

[45] Date of Patent: May 26, 1992

[54] HETEROJUNCTION METHOD AND STRUCTURE

[75] Inventors: Jenn-Hwa Huang, Gilbert; Jonathan K. Abrokwah, Tempe, both of Ariz.

[73] Assignee: Motorola, Inc., Schaumburg, Ill.

[21] Appl. No.: 673,438

[22] Filed: Mar. 22, 1991

[51] Int. Cl.$^5$ .......................................... H01L 21/265
[52] U.S. Cl. ...................................... 437/40; 437/29; 437/41; 437/59; 148/DIG. 72; 148/DIG. 53
[58] Field of Search ................ 437/40, 912, 911, 59, 437/29, 42, 41; 148/DIG. 72, DIG. 53, DIG. 65; 357/16, 22 MD, 42

[56] References Cited

U.S. PATENT DOCUMENTS

| | | | |
|---|---|---|---|
| 4,652,896 | 3/1987 | Das et al. | 357/16 |
| 4,683,637 | 8/1987 | Varker et al. | 437/40 |
| 4,733,283 | 3/1988 | Kuroda | 357/16 |
| 4,742,379 | 5/1988 | Yamashita et al. | 357/16 |
| 4,748,484 | 5/1988 | Takakuwa et al. | 357/16 |
| 4,830,980 | 5/1989 | Hsieh | 437/40 |
| 4,889,831 | 12/1989 | Ishii et al. | 148/DIG. 55 |
| 4,927,782 | 5/1990 | Davey et al. | 437/41 |
| 4,975,382 | 12/1990 | Takasugi | 437/41 |
| 4,977,100 | 12/1990 | Shimura | 437/44 |
| 5,011,785 | 4/1991 | Nguyen | 437/911 |
| 5,023,675 | 6/1991 | Ishikawa | 357/16 |

FOREIGN PATENT DOCUMENTS

0016577  1/1987  Japan ............................. 437/40

*Primary Examiner*—Brian E. Hearn
*Assistant Examiner*—Michael Trinh
*Attorney, Agent, or Firm*—Harry Wolin

[57] ABSTRACT

A method of fabricating heterojunction structures includes providing a semiconductor substrate and forming a plurality of semiconductor layers thereon. Ohmic and gate contacts are then formed on the plurality of semiconductor layers and portions of at least one of the semiconductor layers disposed between the ohmic and gate contacts are removed. Gate metal is then formed on the gate contacts. Source and drain regions are formed in the semiconductor layers and the formation is self-aligned to the gate metal. Following the formation of the source and drain regions, ohmic metal is formed on the ohmic contacts.

12 Claims, 2 Drawing Sheets

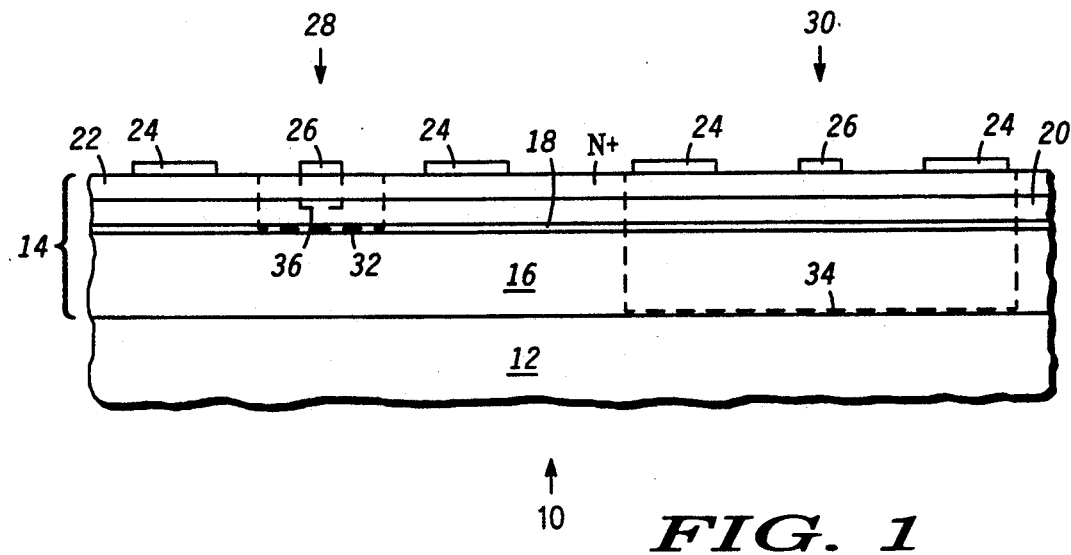
FIG. 1
FIG. 2
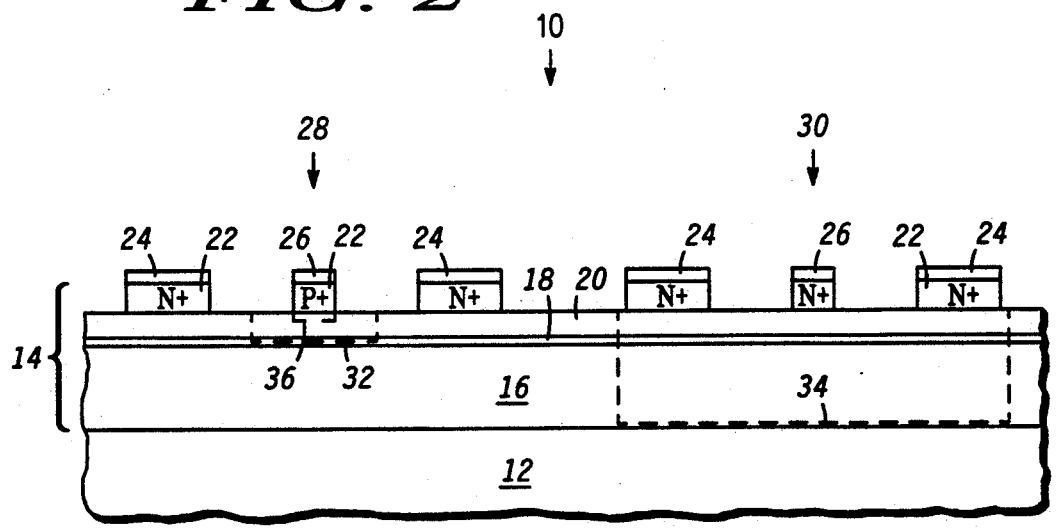

HETEROJUNCTION METHOD AND STRUCTURE

FIELD OF THE INVENTION

This invention relates, in general, to the semiconductor arts and more particularly to a heterojunction method and structure that may be employed with complementary heterostructure field effect transistors (HFETs).

BACKGROUND OF THE INVENTION

Heterojunction structures such as enhancement/depletion mode structures which employ only N type FETs and complementary HFET structures which comprise a P type FET and an N type FET are well known in the semiconductor art.

Complementary HFETs are most often employed for high speed, low power applications. These applications require extremely low gate leakages. However, the types of complementary HFET structures well known in the art often have relatively high gate leakages which cause detrimental effects. One reason for the relatively high gate leakages in these structures is that the gate barrier heights of the devices are too low. Accordingly, it would be desirable to increase the gate barrier heights of the devices to reduce gate leakage.

High speed, low power applications also require that the threshold voltages of devices be relatively low. Delta doping techniques are known in the art and are used to adjust threshold voltage. One structure that employs N type delta doping includes gate metal being formed directly on an insulator and a thin (atomic scale) N type barrier layer which is highly doped on the order of $4 \times 10^{18}$ atoms/cm$^3$. The threshold voltage may be changed by varying the dopant concentration of the barrier layer. However, the barrier layer cannot be doped at a concentration necessary to enable both the N FET and the P FET of a complementary HFET structure to have sufficiently low threshold voltages. Because the N FET and P FET are coupled in a complementary HFET structure, the threshold voltage will decrease for the N FET while increasing the P FET and vice versa for P type delta doping. Accordingly, it would be desirable to have a complementary HFET structure wherein the threshold voltage of both the P FET and the N FET may be kept relatively low.

SUMMARY OF THE INVENTION

A method of fabricating heterojunction structures includes providing a semiconductor substrate and forming a plurality of semiconductor layers on the substrate. Ohmic and gate contacts are formed on the plurality of semiconductor layers and the portions of at least one of the plurality of semiconductor layers disposed between the ohmic and gate contacts are removed. Gate metal is then formed on the gate contacts and source and drain regions are formed in the plurality of semiconductor layers. This formation is self-aligned to the gate metal. Following the formation of the source and drain regions, ohmic metal is formed on the ohmic contacts.

BRIEF DESCRIPTION OF THE DRAWINGS

FIGS. 1-3 are highly enlarged cross-sectional views of a complementary HFET structure during processing in accordance with the present invention.

DETAILED DESCRIPTION OF THE PREFERRED EMBODIMENTS

Figure 3:
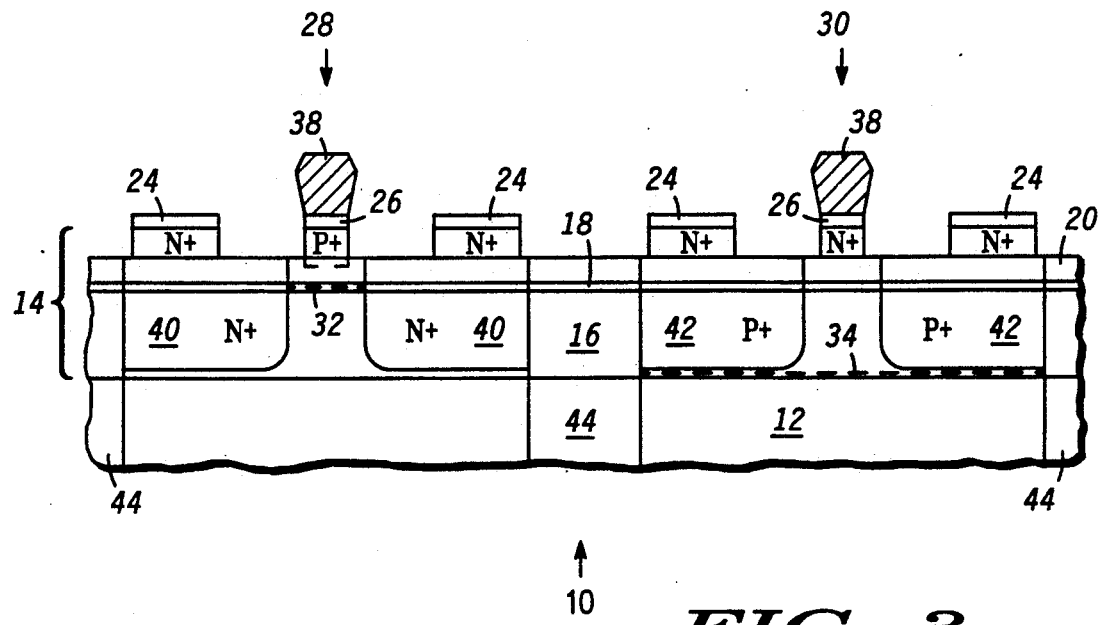

FIGS. 1-3 are highly enlarged cross-sectional views of a complementary HFET structure 10 during processing in accordance with the present invention. Structure 10 includes a substrate 12. As disclosed herein, substrate 12 is semi-insulating and comprises undoped LEC gallium arsenide. It should be understood that the present invention may be employed utilizing other semiconductor and compound semiconductor substrates.

A plurality of semiconductor layers 14 are formed on substrate 12. As disclosed herein, plurality of semiconductor layers 14 all comprise compound semiconductor materials. Plurality of semiconductor layers 14 include buffer layer 16. Buffer layer 16 comprises gallium arsenide and has a thickness in the range of 2000 to 5000 angstroms. Buffer layer 16 may be formed by well known methods such as MBE. Buffer layer 16 has a P conductivity type and a dopant concentration of the order of 10 atoms/cm$^3$. It should be understood that buffer layer 16 is non-intentionally doped meaning that the dopant in buffer layer 16 is from the ambient and not from specific implantation or in situ doping steps.

Plurality of semiconductor layers 14 further include channel layer 18. Channel layer 18 comprises indium gallium arsenide which is on the order of 150 angstroms thick in this embodiment. Channel layer 18 is non-intentionally doped P type and has a dopant concentration on the order of $10^{14}$ atoms/cm$^3$. An aluminum gallium arsenide layer 20 is formed on channel layer 18. As shown herein, layer 20 is on the order of 250 angstroms thick and is undoped. A barrier layer 22 is formed on layer 20. Barrier layer 22 comprises graded indium gallium arsenide in this embodiment wherein the composition varies from gallium arsenide at the interface with layer 20 to 50 percent indium gallium arsenide. Barrier layer 22 is on the order of 500 angstroms thick. Barrier layer 22 is heavily doped having an N+conductivity type and a dopant concentration on the order of $2 \times 10^{19}$ atoms/cm$^3$. As is depicted by the drawings, plurality of semiconductor layers 14 include layers 16, 18, 20 and 22.

Ohmic contacts 24 and gate contacts 26 are formed on plurality of semiconductor layers 14 and specifically on barrier layer 22. As disclosed herein, ohmic contacts 24 and gate contacts 26 comprise tungsten nitride although they may also comprise tungsten based refractory metals. Ohmic contacts 24 and gate contacts 26 are on the order of 250 angstroms thick and are formed simultaneously. Ohmic contacts 24 and gate contacts 26 are formed by depositing a conformal layer of tungsten nitride on barrier layer 22. The conformal layer is then reactive ion etched to form ohmic contacts 24 and gate contacts 26. Because ohmic contacts 24 and gate contacts 26 are defined by the same processed step, there is no need to align the ohmic contacts to the gates. This allows very tight spacing between contacts 24 and 26. Further, since the ohmic contacts are defined at this very early stage of the process, they may be employed to protect the portions of barrier layer 22 disposed therebeneath during future processing steps.

Following the formation of ohmic contacts 24 and gate contacts 26, the internal processing of an N type FET 28 and a P type FET 30 begin. Initially, a channel implant represented by dotted lines 32 is performed in channel layer 18 of N FET 28. An N type dopant such as silicon is implanted so that a dopant concentration on the order of $10^{17}$ to $10^{18}$ atoms/cm$^3$ is obtained in channel layer 18 of N FET 28. Next, an N well implant represented by dotted lines 34 is performed in P FET 30. N well implant 34 is performed by implanting an N type dopant such as silicon into buffer layer 16 of P FET 30. N well implant 34 creates a dopant concentration on the order of $10^{15}$ to $10^{16}$ atoms/cm$^3$ in buffer layer 16 of P FET 30. A P+ gate implant represented by dotted lines 36 is performed by a shallow implant of beryllium or another P type dopant into barrier layer 22 of N FET 28. Co-implantation of fluorine and beryllium or arsenic and beryllium may be employed to achieve shallow implants. P+ gate implant 36 must be sufficient to overcome the N type doping of barrier layer 22 so that a P+ dopant concentration on the order of $10^{19}$ to $10^{20}$ atoms/cm$^3$ may be obtained beneath gate contact 26 of N FET 28 in barrier layer 22. It should be understood that channel implant 32, well implant 34 and gate implant 36 are all performed using standard photoresist masking techniques. Further, implants 32, 34 and 36 are implanted through ohmic contacts 24 and/or gate contacts 26 as the case may be.

Now referring specifically to FIG. 2. Following implants 32, 34 and 36, indium gallium arsenide barrier layer 22 is etched so that all portions disposed between ohmic contacts 24 and gate contacts 26 are removed. Preferably barrier layer 22 is reactive ion etched and the etched chemistry is selective so that it does not etch aluminum gallium arsenide layer 20. Following the etch, the portions of barrier layer 22 that remain are disposed directly beneath ohmic contacts 24 and gate contacts 26. This greatly increases the barrier height of gate contacts 26 in both N FET 28 and P FET 30. The increased barrier height of ohmic contacts 24 and gate contacts 26 greatly reduces gate leakage in FETs 28 and 30. The reduced gate leakage greatly enhances the high speed performance of low power devices.

Now referring specifically to FIG. 3. Following the etch of barrier layer 22, a conformal dielectric layer (not shown) is deposited over the surface of structure 10. Preferably, the conformal dielectric will be silicon dioxide which is formed by PECVD. The conformal dielectric layer is then patterned and etched to expose gate contacts 26. Ohmic contacts 24 must remain covered by the conformal dielectric layer. Following the etching of the conformal dielectric layer, gate metal 38 is selectively formed on gate contacts 26. In this embodiment, gate metal 38 comprises tungsten which is at least 2000 angstroms thick and formed by chemical vapor deposition. The formation of gate metal 30 is only on exposed tungsten nitride gate contacts 26 which serve as a seed for the selective formation of gate metal 30. This selective deposition may also be performed by other conventional methods.

Following the formation of gate metal 38, the remainder of the conformal dielectric layer is removed, preferably by reactive ion etching. After the conformal dielectric layer is removed, source and drain regions 40 are formed in N FET 28 and source and drain regions 42 are formed in P FET 30. Source and drain regions 40 are formed by implanting an N type dopant such as silicon into buffer layer 16 to obtain a dopant concentration on the order of $10^{18}$ atoms/cm$^3$. Source and drain regions 42 are formed by implanting a P type dopant such as beryllium into buffer layer 16 to obtain a dopant concentration on the order of $10^{19}$ atoms/cm$^3$. Both source and drain regions 40 and source and drain regions 42 are self-aligned to the respective gate metal 38. It should also be understood that the implant of source and drain regions 40 and 42 is through ohmic contacts 24.

After forming source and drain regions 40 and 42, a second conformal dielectric layer (not shown) is formed over the surface of structure 10. The second conformal dielectric layer also comprises silicon dioxide and is formed by PECVD. Following the formation of the second conformal dielectric layer, a rapid thermal anneal at a temperature on the order of 800 to 850 degrees centigrade is employed to activate the implant of source and drain regions 40 and 42.

Following the activation of source and drain regions 40 and 42, FETs 28 and 30 are isolated. Isolation regions 44 are formed by implanting oxygen into structure 10 through buffer layer 16. As shown, isolation regions 44 extend into substrate 12 although it should be understood that this is not an absolute requirement. Once isolation regions 44 have been formed, they are activated by a rapid thermal anneal at a temperature on the order of 550 to 600 degrees centigrade.

Figure 4:
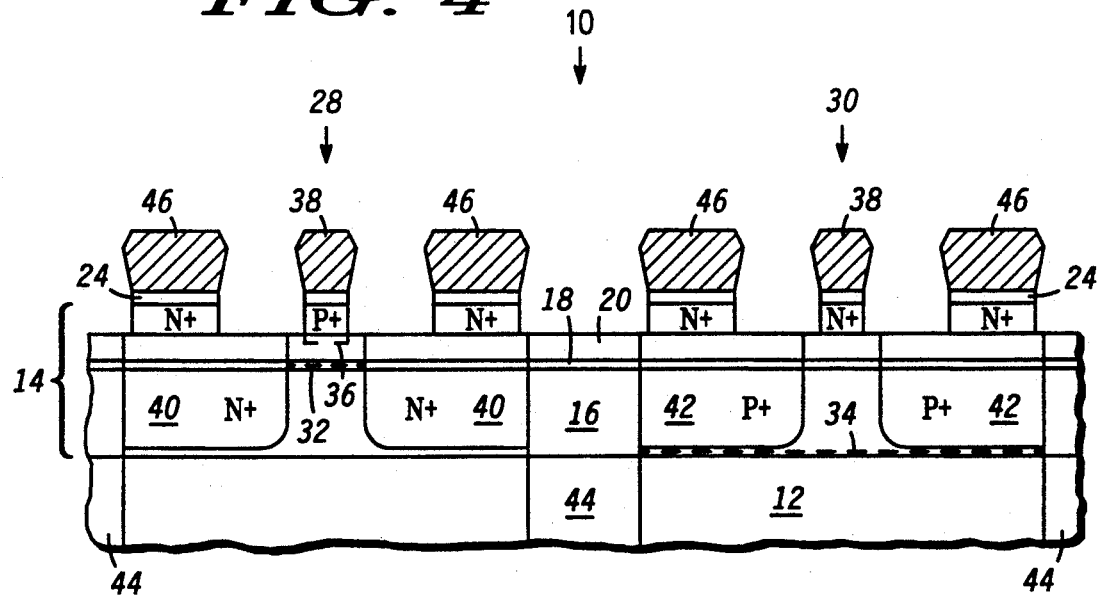
FIG. 4 is a highly enlarged cross-sectional view of a complementary HFET structure in accordance with the present invention.

Now referring specifically to FIG. 4 wherein a highly enlarged cross-sectional view of complementary HFET structure 10 is shown. Following the activation of isolation regions 44, the second conformal dielectric layer is etched back to expose ohmic contacts 24. Once ohmic contacts 24 are exposed, ohmic metal 46 is formed thereon. As shown herein, ohmic metal 46 comprises tungsten which is selectively deposited on tungsten nitride ohmic contacts 24 and has a thickness of at least 2000 angstroms. This may be done by chemical vapor deposition or other methods well known in the art. It should be understood that although tungsten is employed for gate metal 46 herein, other well known metals such as gold and aluminum may be selectively deposited to reduce gate resistance. The deposition of gold or aluminum should follow the rapid thermal anneal so that these metals do not react with the tungsten nitride of ohmic contacts 24.

Local interconnects (not shown) may be formed on structure 10. The formation of these local interconnects may occur simultaneously with the formation of ohmic metal 46 or following the formation of ohmic metal 46. Local interconnects may be employed to connect ohmic metal 46 to gate metal 38 or even to connect gate metal 38 of N type FET 28 to gate metal 38 of P type FET 30. It should be understood that in order to selectively form these local interconnects, a tungsten nitride or similar seed layer must be employed.

As shown herein, structure 10 depicts complementary HFETS. However, the method and structure disclosed herein is also well suited for enhancement/depletion mode structures. Enhancement/depletion mode structures make use of N type FETs only. Accordingly, it should be understood that an enhancement/depletion mode structure may be made by forming two N FETS. This would include an N FET channel implant 32 and a P+ gate implant 36 (both as shown in FIG. 2) into FET 30 with the elimination of N well implant 34.

Structure 10 as disclosed herein has many advantages over the prior art. The increased barrier height of N FET 28 significantly reduces gate leakage. Further, threshold voltage is lowered because the implantation of channel implant 32 and gate implant 36 are performed independently of any channel implant into P FET 30. This allows the threshold voltage to be separately adjusted for both N FET 28 and P FET 30.

The simultaneous formation of ohmic contacts 24 and gate contacts 26 eliminates the need to align ohmic contacts to gates. This allows very tight spacing between ohmic contacts and gates. Because the portions of barrier layer 22 disposed beneath ohmic contacts 24 are formed at a very early process stage, they may be protected during future processing. Finally, the method disclosed herein is inherently planar. Therefore, it is easy to fabricate and integrate to very high circuit densities.

Thus it is apparent that there has been provided, in accordance with the invention, an improved heterojunction method and structure. While specific embodiments of the invention have been shown and described, further modifications and improvements will occur to those skilled in the art. It is desired that it be understood, therefore, that this invention is not limited to the particular forms shown and it is intended in the appended claims to cover all modifications which do not depart from the spirit and scope of this invention.

What is claimed is:

1. A method of fabricating heterojunction structures comprising the steps of:
   providing a semiconductor substrate;
   forming a plurality of semiconductor layers on said substrate, said plurality of semiconductor layers including a channel layer and at least one additional layer disposed on said channel layer;
   forming ohmic and gate contacts on said plurality of semiconductor layers;
   removing portions of said at least one additional layer of said plurality of semiconductor layers that are disposed between said ohmic and gate contacts wherein no portions of said channel layer are removed;
   forming gate metal on said gate contacts;
   forming source and drain regions in said plurality of semiconductor layers, the formation of said source and drain regions being self-aligned to said gate metal; and
   forming ohmic metal on said ohmic contacts.

2. The method of claim 1 wherein an undoped gallium arsenide substrate is provided and the forming a plurality of semiconductor layers step includes forming a gallium arsenide buffer layer on said substrate, forming an indium gallium arsenide channel layer on said buffer layer, forming an aluminum gallium arsenide layer on said channel layer and forming an N+ graded indium gallium arsenide layer on said aluminum gallium arsenide layer.

3. The method of claim 1 wherein the forming ohmic and gate contacts step includes forming tungsten nitride or tungsten based refractory metal contacts.

4. The method of claim 2 wherein the removing portions step includes removing portions of the N+ indium gallium arsenide layer.

5. The method of claim 3 wherein the forming gate metal step includes selectively depositing tungsten.

6. The method of claim 2 wherein the structure comprises complementary HFETs and further includes the steps of forming an N type channel region in the channel layer of a first transistor structure, forming an N type well region in a second transistor structure, forming a P type gate region in said first transistor structure and isolating said first and second transistor structures.

7. A method of fabricating a complementary HFET structure comprising the steps of:
   providing a gallium arsenide substrate;
   forming a plurality of compound semiconductor layers on said substrate;
   forming a tungsten nitride or tungsten based refractory metal contact layer on said plurality of compound semiconductor layers;
   forming ohmic and gate contacts from said contact layer;
   forming an N type channel region in said plurality of compound semiconductor layers of a first transistor structure;
   forming an N type well region in said plurality of compound semiconductor layers of a second transistor structure;
   forming a P type gate region in said plurality of compound semiconductor layers of said first transistor structure;
   etching the portions disposed between said ohmic and gate contacts of at least one of said plurality of compound semiconductor layers;
   selectively depositing tungsten gate metal on said gate contacts;
   forming N type source and drain regions in said first transistor structure and P type source and drain regions in said second transistor structure, the formation of said source and drain regions beings self-aligned to said gate metal;
   isolating said first and second transistor structures; and
   forming ohmic metal on said ohmic contacts.

8. The method of claim 7 wherein the forming a plurality of compound semiconductor layers step comprises a forming a gallium arsenide buffer layer on said substrate, forming an indium gallium arsenide channel layer on said buffer layer, forming an aluminum gallium arsenide layer on said channel layer and forming an N+ graded indium gallium arsenide layer on said aluminum gallium arsenide layer.

9. The method of claim 8 wherein the etching the portions step includes etching portions of the N+ indium gallium arsenide layer.

10. The method of claim 7 wherein the forming an N type channel region step and the forming an N type well region step are performed simultaneously.

11. The method of claim 7 wherein the ohmic metal comprises tungsten, gold or aluminum.

12. The method of claim 7 wherein the ohmic metal comprises selectively deposited tungsten.

* * * * *